United States Patent [19]

Soclof

[11] 4,419,150
[45] Dec. 6, 1983

[54] METHOD OF FORMING LATERAL BIPOLAR TRANSISTORS

[75] Inventor: Sidney I. Soclof, San Gabriel, Calif.

[73] Assignee: Rockwell International Corporation, El Segundo, Calif.

[21] Appl. No.: 418,862

[22] Filed: Sep. 16, 1982

Related U.S. Application Data

[62] Division of Ser. No. 220,399, Dec. 29, 1980.

[51] Int. Cl.$^3$ .................... H01L 21/22; H01L 21/265
[52] U.S. Cl. ..................................... 148/187; 29/578; 29/580; 29/576 W; 357/35
[58] Field of Search ................. 148/187; 29/571, 578, 29/580, 576 W; 357/35

[56] References Cited

U.S. PATENT DOCUMENTS

| | | | |
|---|---|---|---|
| 3,919,005 | 11/1975 | Schinella et al. | 148/187 X |
| 3,945,857 | 3/1976 | Schinella et al. | 148/187 X |
| 4,005,451 | 1/1977 | Martinelli et al. | 357/35 |
| 4,140,558 | 2/1979 | Murphy et al. | 29/578 X |
| 4,252,582 | 2/1981 | Anantha et al. | 29/578 X |
| 4,283,236 | 8/1981 | Sirsi | 148/187 |
| 4,290,844 | 9/1981 | Rotolante et al. | 148/187 X |
| 4,298,402 | 11/1981 | Hingarh | 29/580 X |
| 4,323,913 | 4/1982 | Murrmann et al. | 148/187 X |
| 4,338,138 | 7/1982 | Cavaliere et al. | 148/187 X |

*Primary Examiner*—G. Ozaki
*Attorney, Agent, or Firm*—H. Fredrick Hamann; Wilfred G. Caldwell

[57] ABSTRACT

The invention is a sub-micron dielectrically isolated transistor and method of making the same wherein hundreds of such transistors may be fabricated on a single chip with each transistor comprising an active region surrounded by a field oxide region, N+ spaced-apart doped portions within said regions and a P+ doped portion of said region spaced from each N+ doped portions, and electrical connections to the base P+ portion and the collector and emitter N+ portions. These regions are established by first forming boundary recesses about each active portion where a transistor will be formed, depositing arsenic in the recesses to form N+ regions in the transistor-active region adjacent the recesses, deepening the recesses, diffusing boron into the deepened recesses to dope the substrate P-type beneath the N+ regions and also between the N+ regions, and patterning and metallizing the substrate to develop the electrical connections of the base, emitter and collector electrodes.

5 Claims, 7 Drawing Figures

METHOD OF FORMING LATERAL BIPOLAR TRANSISTORS

This application is a division of application Ser. No. 220,399, filed Dec. 29, 1980.

FIELD OF THE INVENTION

This invention is a novel structure and method for forming a sub-micron bipolar dielectrically isolated transistor utilizing VLSI chip processing steps to fabricate hundreds of such devices simultaneously.

BACKGROUND OF THE INVENTION

Techniques extracted from the prior art come from the field of sub-micron fabrication technology wherein the dimensional resolution is now comparable to or even smaller than the thicknesses of the thermally grown silicon oxide layers on silicon. Also the dimensions are now comparable to or even smaller than the base widths used for double diffused transistors, i.e. 0.4–1.0 micrometers. From these techniques the novel structure and method for the bipolar transistor with greatly reduced parasitic capacitance and resistance have been devolved in unique combination and sequence.

SUMMARY OF THE INVENTION

The invention is a novel lateral NPN transistor forming on a substrate by making a recess in the substrate bounding the region for the transistor, N+ doping spaced apart portions of such region, P doping the non-N+ doped portions of the region, and filling the recess with field oxide. Conventional electrical connections are established to each of the N+ spaced apart portions and to the P doped non-hypen N+ doped portions with the latter comprising the base for the transistor and the former N+ regions being the collector and emitter.

DESCRIPTION OF THE PREFERRED EMBODIMENT

Figure 5:
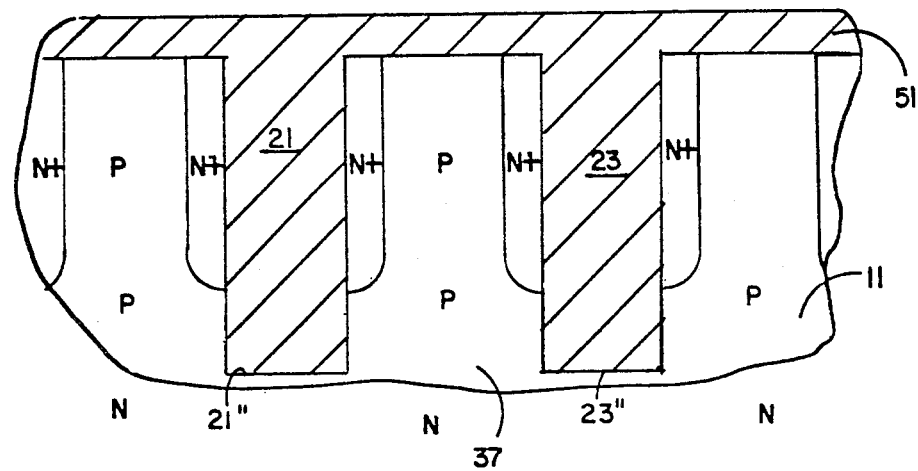
FIG. 5 shows the recessed regions extending into the N doped substrate, beyond the P doped regions and the boundary recesses filled with oxide.
Figure 6:
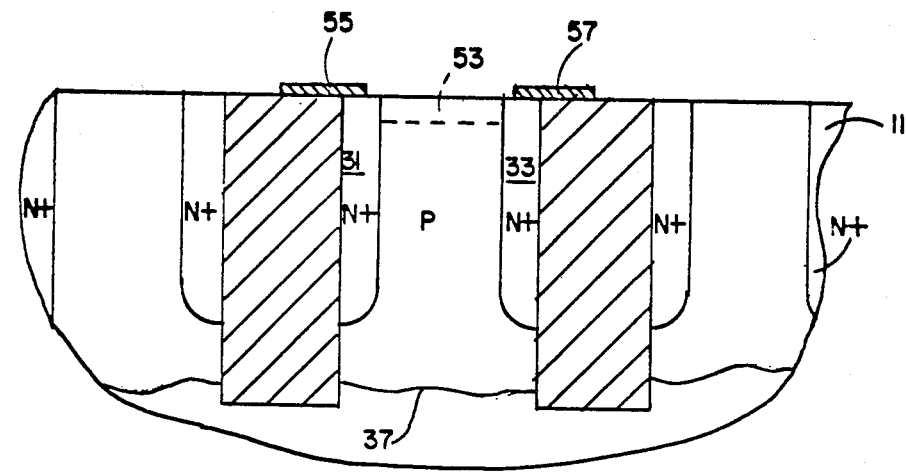
FIG. 6 shows the P+ implanting of the non-N+ doped active region and the results of the patterning and metallization steps.

The drawings including FIGS. 1–6 show a preferred fabrication method for the structure of FIG. 6 with the steps being recited in preferred order and each function accomplished by a preferred specified processing step.

Figure 1:
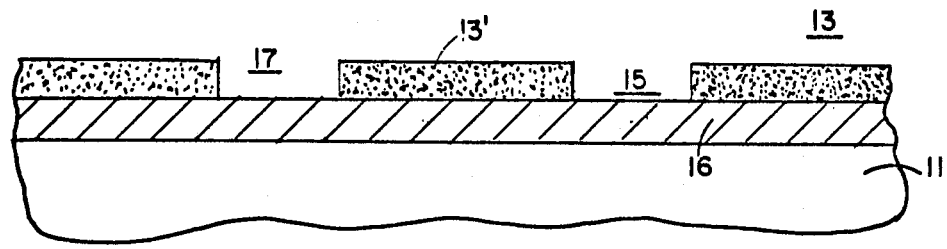
FIG. 1 is a view in cross-section through a region of the substrate where a single transistor will be formed showing photoresist outlining the regions to be recessed into the substrate and also protecting the active region of the transistor.

In FIG. 1, the N-type substrate 11 may comprise silicon or silicon-on-sapphire. It is covered with a silicon oxide layer 16 and a photoresist layer 13 which is masked, exposed to actinic radiation, and the photoresist removed where soluble in the regions 15 and 17 which outlines the portions of the substrate to be slotted or recessed around the boundary of the active region 19 for a single transistor shown as that region covered by the photoresist 13'.

Figure 2:
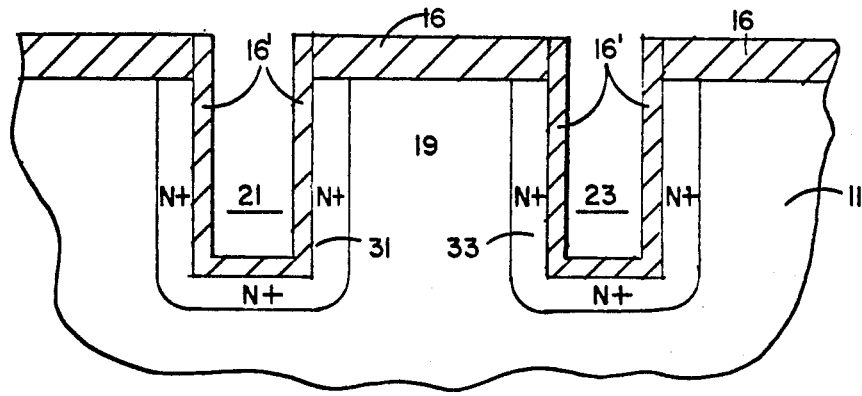
FIG. 2 shows the substrate slotted along the boundary recess regions with N+ doping having been achieved followed by oxide growth.
Figure 7:
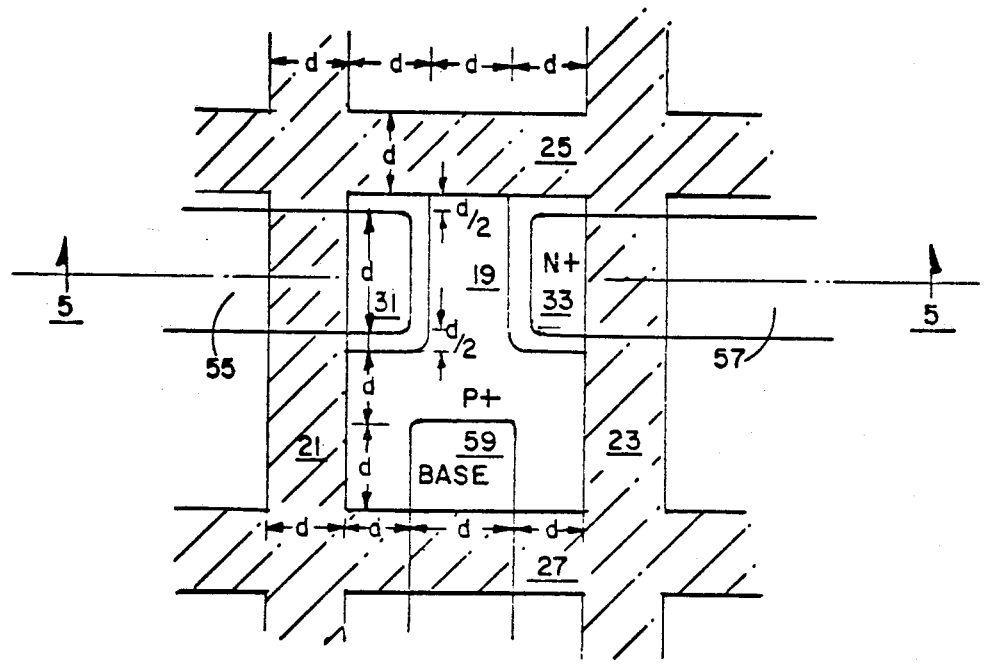
FIG. 7 is a plan view of a single lateral NPN transistor showing the boundary recesses filled with field oxide and the emitter, base and collector electrodes with electrical connections included.

In FIG. 2 the slots 21 and 23 have been milled into substrate 11 in the regions 17 and 15 while the other regions were protected by the photoresist 13. It will be understood that slots or recesses 21 and 23, as shown in FIG. 2, only bound the active region 19 on two sides, but in reality this boundary recessing or slotting extends completely about the transistor active region 19 as illustrated in FIG. 7 wherein the slot portions 21 and 23 are seen as bounding two sides of region 19 whereas slots 25 and 27 bound the other two regions such that the entire active area 19 is bounded by recesses or slots.

Returning to FIG. 2 the next step in the preferred process is the deposition of arsenic into slots 21 and 23 to form the N+ doped regions 31 and 33 adjacent to the slots 21 and 23 within substrate 11.

Following the N+ doping step, a silicon oxide is grown over the entire exposed surface of substrate 11 as shown at 16 and 16'.

Figure 3:
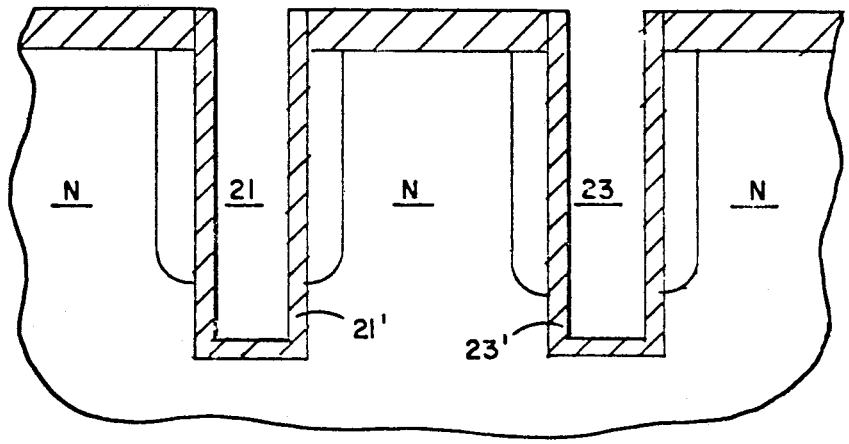
FIG. 3 shows the boundary recesses deepened beyond the N+ doped regions.
Figure 4:
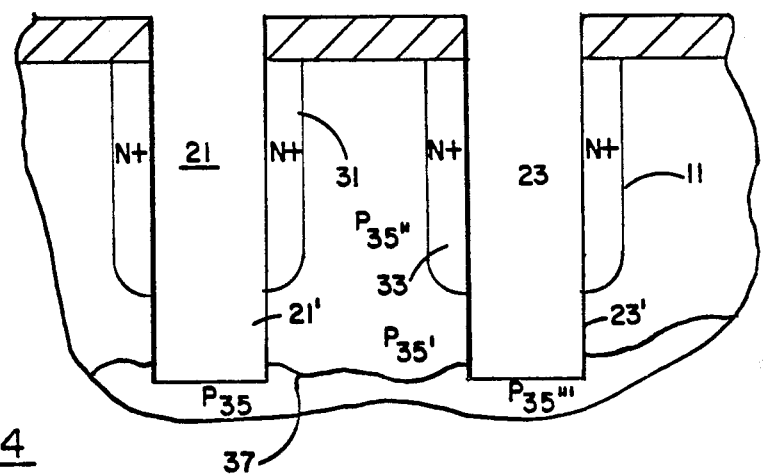
FIG. 4 shows the P region formed by diffusion through the slots and also between the N+ regions.

Proceding to FIG. 3, the slots 21 and 23 are milled deeper as shown by the extensions 21' and 23' which penetrate substrate 11 deeper than the N+ doped regions 31 and 33. Also, the silicon dioxide lining slots 21 and 23, as deepened, is removed following conventional practices to prepare for the boron diffusion step best depicted in FIG. 4. Here the P-type regions are indicated at 35, 35', 35" and 35'''. The N-type region of substrate 11 is now roughly defined by the line 37. It will be seen that the P region is beneath the slot 21 and extension 21' and the slot 23 and extension 23', and also occupies the region between the N+ active portions 31 and 33.

In FIG. 5 the third deepening of slots 21 and 23 is effected, again preferably by ion milling, to extend them to their bottoms 21" and 23" which now penetrates the N region beneath curve 37. The substrate 11 is then oxidized sufficiently to fill the slots 21 and 23 completely with silicon oxide and to cover the substrate 11 with a surface layer 51 of silicon oxide. At this stage it may be noted that the silicon oxide of the recesses or slots completely electrically isolates the N+P N+ action region of the transistor device being formed in the active region within this isolation boundary.

In FIG. 6 the oxide has been stripped completely off the top, shown as the oxide 51, as by etching, to allow for the boron B+ implant indicated by the P+ designation 53. One way of achieving this type doping is to use low energy boron diffusion for the P regions and high energy boron diffusion for the P+ regions.

Also in FIG. 6 a layer of metallization has been applied to the upper surface of the substrate 11, and it has been covered by photoresist and patterned, removed where soluble and the metallization etched away to leave the particular metal conductors 55 and 57 shown in contact with the N+ region 31 and the N+ region 33. In the same manner, the base lead 59 has been formed from the metallization and patterning steps, as shown in FIG. 6 such that electrode connections are made to emitter region 31, collector region 33 and base region 59. It will be noted from FIG. 7 that the sectional view for FIG. 6 is taken along the plane 5-5. Also, the transistor of FIG. 7 is sized 4d×5d to occupy an area of 20d squared, wherein d is a dimension 0.4 to 1 micrometer. It may be seen that the vertical dimension comprises the first d of for the base region 59, the second d for the spacing between the base region and the emitter region 31, the third d for the width of the emitter region 31 and d/2+d/2 for the spacing between electrode 55 and the extremes of the N+ region 31 with the fifth d encompassing one recess 25. The dimension in the orthogonal direction utilizes the first d for the width of the recess 21, the second d for the spacing to the electrode 59, the third d for the width of the base electrode 59 and the fourth d measures to recess 23. In summary, these bipolar transistors have extremely small areas and the parasitic capacitance and resistance is also greatly reduced. The total size of the transistor is not much greater than the active area of the transistor. The base emitter junction capacitance and the collector base capacitance are made very small. Also, the base spreading resistance is small. Since the base width can be made small, i.e. approaching approximately 0.1 micrometers, a high gain and low transit time can be achieved. Also, a symmetrical transistor with a very low collector to emitter saturation voltage is available. Further, the collector resistance is also very small.

While departures from the afore-mentioned process can be made by substituting doping materials for ion-implanting or ion implanting steps for doped materials, nevertheless the principles of the invention are uniquely set forth in the appended claims which it intended measure the scope of this invention, wherein:

What is claimed is:

1. The method of making a NPN lateral transistor on an N doped substrate, comprising the steps of:

forming a recess in the substrate bounding the region for the transistor;
   N+ doping spaced apart portions of said regions;
   P doping the non-N+ doped portions of said region;
   filling said recess with field oxide; and,
   establishing electrical connections to each of said N+ spaced apart portions and to the P doped non-N+ doped portions of said region.

2. A method for forming an array of sub-micron dimensioned NPN lateral transistors on a substrate doped N-type, wherein each transistor is formed comprising the following steps:

masking the substrate to outline boundary regions for each active region to comprise a transistor;
   slotting the substrate in said boundary regions;
   doping of substrate via the slotted boundary regions to render regions of the substrate adjacent the boundary regions N+ doped;
   deepening the slotted boundary regions;
   doping the substrate via the deepened regions to render regions of the substrate beneath the N+ regions P doped;
   filling the deepened slotted boundary regions with field oxide;
   doping the active region of each transistor P type except for the N+ portions thereof;
   enhancing the last mentioned P type to P+ adjacent the substrate surface which is slotted; and,
   metallizing and patterning said substrate surface to provide electrical connections to each of said N+ regions and to said P+ region.

3. The method of claim 2, wherein;
   said slotting and deepening is effected by ion milling.

4. The method of claim 3, wherein;
   said N+ doping is achieved by diffusion following oxidation of the substrate and removal of the oxide from the slotted boundary regions.

5. The method of claim 4 wherein;
   said P doping is achieved by implanting boron.

* * * * *